(12) United States Patent
Bilenko et al.

(10) Patent No.: US 11,955,584 B2
(45) Date of Patent: Apr. 9, 2024

(54) LIGHT EMITTING ELEMENT PACKAGE

(71) Applicant: SEOUL VIOSYS CO., LTD., Gyeonggi-do (KR)

(72) Inventors: Yuriy Bilenko, Gyeonggi-do (KR); Ki Yon Park, Gyeonggi-do (KR)

(73) Assignee: Seoul Viosys Co., Ltd., Gyeonggi-do (KR)

(*) Notice: Subject to any disclaimer, the term of this patent is extended or adjusted under 35 U.S.C. 154(b) by 33 days.

(21) Appl. No.: 17/086,734

(22) Filed: Nov. 2, 2020

(65) Prior Publication Data
US 2021/0050483 A1 Feb. 18, 2021

Related U.S. Application Data

(63) Continuation of application No. PCT/KR2019/005259, filed on May 2, 2019.

(30) Foreign Application Priority Data

May 2, 2018 (KR) .......................... 10-2018-0050438

(51) Int. Cl.
  *H01L 33/44* (2010.01)
  *H01L 33/10* (2010.01)
  (Continued)

(52) U.S. Cl.
  CPC ............ *H01L 33/44* (2013.01); *H01L 33/486* (2013.01); *H01L 33/54* (2013.01); *H01L 33/56* (2013.01);
  (Continued)

(58) Field of Classification Search
  CPC .......... H01L 33/20; H01L 33/60; H01L 33/58; H01L 33/486; H01L 33/483; H01L 33/54;
  (Continued)

(56) References Cited

U.S. PATENT DOCUMENTS 5,596,450 A    1/1997 Hannon et al.
2002/0098371 A1    7/2002 Higuchi et al.
(Continued)

FOREIGN PATENT DOCUMENTS

CN    107564895 A    1/2018
CN    108231973 A * 6/2018  ............. H01L 33/48
(Continued)

OTHER PUBLICATIONS

International Search Report Issued in International Application PCT/KR2019/005259, dated Aug. 8, 2019.
(Continued)

*Primary Examiner* — Antonio B Crite
(74) *Attorney, Agent, or Firm* — LaBatt, LLC

(57) ABSTRACT

A light emitting element package includes a substrate provided with an interconnect portion, a light emitting element mounted on the substrate and connected to the interconnect portion, and a cover member contacting an upper surface of the light emitting element while covering the light emitting element. The cover member comprises an organic polymer, which can have polymer nodes linked to each other, and has a light transmittance of 85% or more in an ultraviolet wavelength range.

20 Claims, 3 Drawing Sheets

(51) Int. Cl.
*H01L 33/20* (2010.01)
*H01L 33/32* (2010.01)
*H01L 33/38* (2010.01)
*H01L 33/48* (2010.01)
*H01L 33/54* (2010.01)
*H01L 33/56* (2010.01)
*H01L 33/60* (2010.01)
*H01L 33/62* (2010.01)

(52) U.S. Cl.
CPC .............. *H01L 33/60* (2013.01); *H01L 33/62* (2013.01); *H01L 33/32* (2013.01)

(58) Field of Classification Search
CPC ......... H01L 33/10; H01L 33/62; H01L 24/97; H01L 2924/18161
See application file for complete search history.

(56) References Cited

U.S. PATENT DOCUMENTS

| | | | |
|---|---|---|---|
| 2005/0006651 A1* | 1/2005 | LeBoeuf | H01L 33/502 257/79 |
| 2006/0163596 A1 | 7/2006 | Kim et al. | |
| 2006/0262310 A1 | 11/2006 | Starry et al. | |
| 2009/0194776 A1 | 8/2009 | Pachler | |
| 2012/0074434 A1* | 3/2012 | Park | H01L 33/56 257/E33.072 |
| 2013/0082292 A1* | 4/2013 | Wei | H01L 33/60 156/272.8 |
| 2016/0027970 A1 | 1/2016 | Shatalov et al. | |
| 2017/0092817 A1* | 3/2017 | Ikeda | H01L 33/486 |
| 2018/0006203 A1* | 1/2018 | Liu | H01L 25/0753 |
| 2019/0088824 A1* | 3/2019 | Kim | H01L 33/54 |
| 2019/0181312 A1* | 6/2019 | Qin | H01L 33/62 |
| 2022/0173278 A1* | 6/2022 | Cheng | H01L 33/62 |

FOREIGN PATENT DOCUMENTS

| | | | | |
|---|---|---|---|---|
| JP | 2000-502489 | | 2/2000 | |
| JP | 2002226611 A | | 8/2002 | |
| JP | 2010228192 A | | 10/2010 | |
| JP | 2012226892 A | | 11/2012 | |
| JP | 2017-017110 | | 1/2017 | |
| JP | 2017-045902 | | 3/2017 | |
| JP | 2017161625 A | | 9/2017 | |
| KR | 10-0616680 | | 8/2006 | |
| KR | 10-0623024 | | 9/2006 | |
| KR | 10-1188566 | | 10/2012 | |
| KR | 10-1197046 | | 11/2012 | |
| KR | 10-1307131 | | 9/2013 | |
| KR | 20150107086 A | * | 9/2015 | ............. H01L 24/97 |
| KR | 20160068715 A | * | 6/2016 | ............. H01L 33/20 |
| WO | WO-2018059599 A1 | * | 4/2018 | ............... F21K 9/60 |

OTHER PUBLICATIONS

Supplementary European Search Report issued in corresponding EP Application No. 19796259.0, dated Dec. 23, 2021, 9 pages.
Examination Report issued in corresponding IN Application No. 202037052374, dated Aug. 4, 2022, 6 pages.
Office action for Japanese Patent Application No. 2020-560770 (with English translation), dated Feb. 28, 2023, 15 pages.
Office Action for Chinese Patent Application No. 201980003121.2 with English translation, dated Aug. 25, 2023, 22 pages.
Office Action for Japanese Patent Application No. 2020-560770 with English translation, dated Aug. 8, 2023, 16 pages.

* cited by examiner

LIGHT EMITTING ELEMENT PACKAGE

CROSS-REFERENCE TO RELATED APPLICATIONS AND PRIORITY

The present application is a continuation of International Application No. PCT/KR2019/005259, filed on May 2, 2019, which claims the benefit of and priority to Korean Patent Application No. 10-2018-0050438, filed on May 2, 2018, the disclosures of which are incorporated herein in their entireties.

TECHNICAL FIELD

Embodiments of the present invention relate to a light emitting element package, and more particularly, to a light emitting element package including a light emitting diode.

BACKGROUND

A light emitting diode (LED) is a semiconductor light emitting element that converts electric current into light.

The light emitting diode may be divided into an individual chip. The light emitting diode is provided in the form of a package to be electrically connected to a printed circuit board, a power supply, or a controller.

SUMMARY

Embodiments of the present invention provide a light emitting element package having good light extraction efficiency.

In accordance with embodiments of the present invention, a light emitting element package includes: a substrate provided with an interconnect portion; a light emitting element mounted on the substrate and connected to the interconnect portion; and a cover member contacting an upper surface of the light emitting element while covering the light emitting element. The cover member comprises Teflon-based organic polymers and has a light transmittance of 85% or more in an ultraviolet wavelength range.

In one embodiment, the light emitting element package may further include a reflective film formed on the substrate. The reflective film may have the Teflon-based organic polymers and the organic polymers of the reflective film are stretchable and expandable.

In one embodiment, the light emitting element package may further include: a sidewall disposed on the substrate and defining a cavity in which the light emitting element is disposed.

In one embodiment, an upper surface of the sidewall may have the same height as a height from an upper surface of the substrate to the upper surface of the light emitting element. In one variation, the upper surface of the sidewall has a height corresponding to a height from the upper surface of the substrate to the upper surface of the light emitting element.

In one embodiment, the cover member may cover the upper surface of the sidewall and the upper surface of the light emitting element.

In one embodiment, the cover member may contact the upper surface and a side surface of the light emitting element to cover the light emitting element.

In one embodiment, an inner surface of the sidewall defining the cavity may be an inclined surface.

In one embodiment, at least part of the reflective film may be disposed on the inner surface of the sidewall.

In one embodiment, the cover member may contact the upper surface and a side surface of the light emitting element and a portion of the substrate to cover the light emitting element and the portion of the substrate.

In one embodiment, the cover member may be formed by depositing a light transmitting material on the substrate and the light emitting element, followed by curing the light transmitting material.

In one embodiment, the cover member may be formed by dropping droplets of a light transmitting material on the substrate, followed by curing the light transmitting material.

In one embodiment, the cover member may be formed in a semispherical shape on the substrate.

In one embodiment, the reflective film may have a light transmittance of 85% or more in the wavelength band of 250 nm to 400 nm.

In one embodiment, the reflective film may have polymer nodes linked to each other by fibrils forming fine porous vacancies.

In one embodiment, the organic polymer of the reflective film may be a polytetrafluoroethylene resin subjected to stretch and expansion. The polytetrafluoroethylene resin may be stretchable and expandable.

In one embodiment, at least one selected from among the substrate, the reflective film, and the cover member may have flexibility.

In one embodiment, the interconnect portion may include an upper interconnect disposed on an upper surface of the substrate and connected to the light emitting element, a penetration interconnect penetrating the substrate and connected to the upper interconnect, and a lower interconnect disposed on a lower surface of the substrate and connected to the penetration interconnect.

In one embodiment, the light emitting element may be a flip-chip type light emitting diode.

In one embodiment, the reflective film and the cover member may have different thicknesses.

Embodiments of the present invention provide a light emitting element having good light extraction efficiency.

DETAILED DESCRIPTIONS OF EMBODIMENTS

The present invention may be implemented in various ways and certain embodiments will be described in detail with reference to the accompanying drawings. However, it should be understood that the present invention is not limited to the following embodiments and includes all modifications, variations, alterations, and equivalents within the spirit and scope of the present invention.

Hereinafter, embodiments of the present invention will be described in detail with reference to the accompanying drawings.

Figure 1:
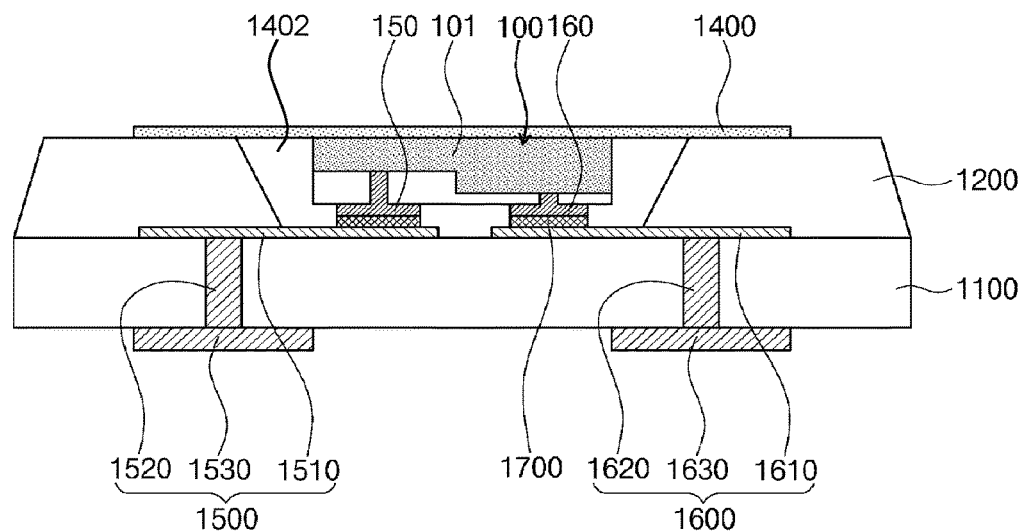
FIG. 1 is a sectional view of a light emitting element package according to one embodiment of the present invention.

FIG. 1 is a sectional view of a light emitting element package according to one embodiment of the present invention. Referring to FIG. 1, a light emitting element package according to one embodiment includes a substrate 1100 having interconnect portions 1500, 1600, a light emitting element 100, a cover member 1400 and a sidewall 1200. The light emitting element 100 is mounted on the substrate 1100 and connected to the interconnect portions 1500, 1600. The cover member 1400 contacts an upper surface of the light emitting element 100 while covering the light emitting element 100. The sidewall 1200 is disposed on the substrate 1100 and defines a cavity in a region in which the light emitting element 100 is disposed.

The substrate 1100 is formed with the interconnect portions 1500, 1600 and the light emitting element 100 and other components may be mounted on an upper surface of the substrate 1100. In some embodiments, the substrate 1100 may be formed of various materials including inorganic materials, organic materials, metals, and the like. For example, the substrate 1100 may be formed of an insulating organic material. Alternatively, the substrate 1100 may be formed of an insulating organic/inorganic material, such as SiC, Si, $Al_2O_3$, AlN, or Teflon®, or may be formed of a metal. For the substrate 1100 formed of a metal, an insulation layer may be further disposed between the substrate 1100 and the interconnect portions 1500, 1600. For the substrate 1100 formed of an organic polymer resin, the substrate 1100 may have flexibility. In some embodiments, the substrate 1100 may be a printed circuit board having the interconnect portions 1500, 1600 printed thereon.

The interconnect portions 1500, 1600 are provided to the substrate 1100 for electrical connection with the light emitting element 100. The interconnect portions 1500, 1600 may include upper interconnects 1510, 1610 formed on the upper surface of the substrate 1100 and connected to the light emitting element 100 described below; penetration interconnects 1520, 1620 penetrating the substrate 1100 and connected to the upper interconnects 1510, 1610; and lower interconnects 1530, 1630 disposed on a lower surface of the substrate 1100 and connected to the penetration interconnect 1520, 1620. The lower interconnects 1530, 1630 may be electrically connected to other external components.

The light emitting element 100 is disposed on the substrate 1100 and may be a flip-chip type light emitting diode. However, it should be understood that the light emitting element 100 may be provided in various forms and may be a lateral type light emitting diode. The light emitting element 100 includes a light emitting structure 101 and first and second electrodes 150, 160, which are connected to the light emitting structure 101. Hereinafter, a flip-chip type light emitting diode will be described as the light emitting element 100 by way of example.

Figure 2:
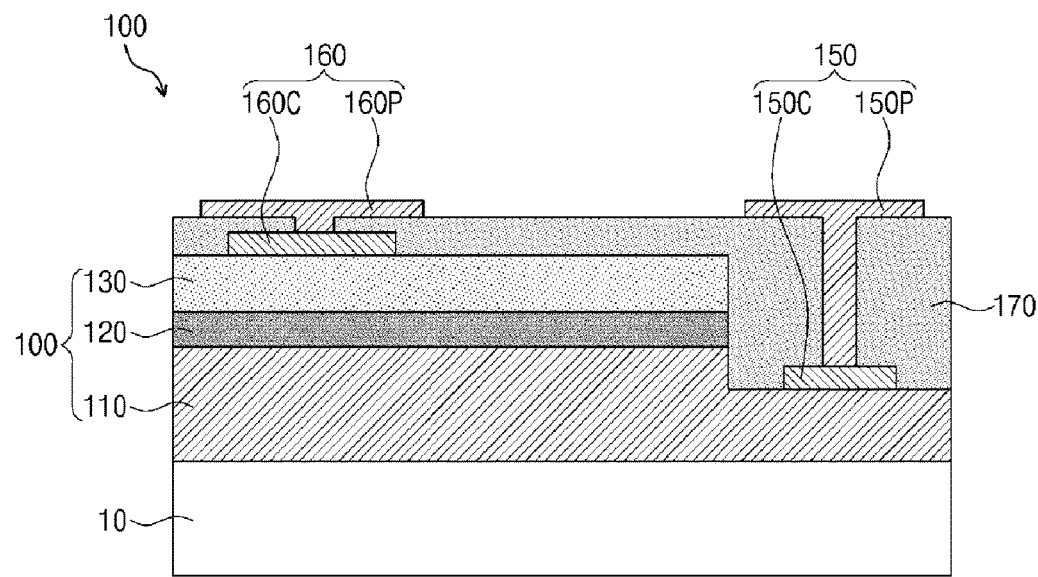
FIG. 2 is a sectional view of a light emitting element of the light emitting element package shown in FIG. 1.

FIG. 2 is a sectional view of a light emitting element 100 of the light emitting element package shown in FIG. 1. It should be noted that in FIG. 2, the light emitting element 100 is shown in an upside down state for convenience of description. Thus, an upper surface of the light emitting element 100 shown in FIG. 1 corresponds to a lower surface of the light emitting element 100 shown in FIG. 2. Herein, spatially relative terms, such as an upper surface, a lower surface, a side surface, an upward direction, a downward direction, and a lateral direction, are defined with reference to the accompanying drawings.

Referring to FIG. 1 and FIG. 2, the light emitting element 100 according to the embodiment may include the light emitting structure 101 formed on a base substrate 10.

The base substrate 10 may be, for example, a sapphire substrate, particularly, a patterned sapphire substrate. Preferably, the base substrate 10 is an insulating substrate, without being limited thereto.

The light emitting structure 101 may include a first semiconductor layer 110, an active layer 120, and a second semiconductor layer 130, which are sequentially stacked.

The first semiconductor layer 110 is a semiconductor layer doped with a first conductivity type dopant. The first conductivity type dopant may be an n-type dopant. The first conductivity type dopant may be Si, Ge, Se, Te, or C.

In one embodiment, the first semiconductor layer 110 may include a nitride-based semiconductor material. For example, the first semiconductor layer 110 may be formed of a semiconductor material having a composition represented by $In_xAl_yGa_{1-x-y}N$ ($0 \leq x \leq 1$, $0 \leq y \leq 1$, $0 \leq x+y \leq 1$). In some embodiments, the semiconductor material having the above composition may include GaN, AlN, AlGaN, InGaN, InN, InAlGaN, AlInN, and the like. The first semiconductor layer 110 may be formed by growing the semiconductor material so as to include the n-type dopant, such as Si, Ge, Sn, Se, Te, and the like.

In some embodiments, the first semiconductor layer 110 may include a first sub-semiconductor layer having a higher dopant concentration and a second sub-semiconductor layer having a lower dopant concentration. The first sub-semiconductor layer may be a contact layer to which the first electrode 150 described below is connected. The first sub-semiconductor layer and the second sub-semiconductor layer may be formed by sequential deposition under control of deposition conditions. For example, the second sub-semiconductor layer may be formed through deposition at a lower temperature than the first sub-semiconductor layer.

In other embodiments, the first semiconductor layer 110 may further include a structure formed by alternately stacking two types of layers having different energy band gaps one above another. The structure formed by alternately stacking the two types of layers having different energy band gaps one above another may be a super lattice structure.

The two types of layers having different energy band gaps are alternately formed and may include different thin crystal layers. In this embodiment, upon alternately stacking the two types of layers having different energy band gaps, the crystal layers may include crystal lattices each having a longer periodic structure than a unit lattice. The two types of layers having different energy band gaps may include a layer having a wide band gap and a layer having a narrow band gap. In one embodiment, the layer having a wide band gap may have a composition represented by $Al_xGa_yIn_{1-x-y}N$ ($0 \leq x < 1$, $0 < y \leq 1$), and may be, for example, a GaN layer. The layer having a narrow band gap may have a composition represented by $Al_xGa_yIn_{1-x-y}N$ ($0 \leq x < 1$, $0 < y \leq 1$) and may be, for example, a $Ga_yIn_{1-y}N$ layer ($0 < y \leq 1$). In one embodiment, at least one of the wide band gap layer and the narrow band gap layer may include an n-type dopant.

The active layer 120 is formed on the first semiconductor layer 110 and acts as a light emitting layer. In the active layer 120, electrons (or holes) injected through the first semiconductor layer combine with holes (or electrons) injected through the second semiconductor layer 130 to emit light generated due to difference in energy band gap between materials forming the active layer 120. The active layer 120 may emit light having at least one peak wavelength selected from among UV light, blue light, green light, and red light.

The active layer 120 may be realized by a compound semiconductor. By way of example, the active layer 120 may be realized by at least one selected from among group III-V or group II-VI compound semiconductors. The active layer 120 may have a quantum well structure, for example, a multi-quantum well structure in which quantum well layers and barrier layers are alternately stacked one above another. However, it should be understood that the active layer 120 is not limited to this structure and may have a quantum wire structure, a quantum dot structure, or the like.

In one embodiment, the quantum well layers may be formed of a semiconductor material having a composition represented by $In_xAl_yGa_{1-x-y}N$ ($0 \leq x \leq 1$, $0 \leq y \leq 1$, $0 \leq x+y \leq 1$). The barrier layers may be formed of a semiconductor material having a composition represented by $In_xAl_yGa_{1-x-y}N$ ($0 \leq x \leq 1$, $0 \leq y \leq 1$, $0 \leq x+y \leq 1$) and may have a different composition than the well layer. Here, the barrier layers may have a wider band gap than the well layers.

The well layer and the barrier layer may include, for example, at least one pair selected from among AlGaAs/GaAs, InGaAs/GaAs, InGaN/GaN, GaN/AlGaN, AlGaN/AlGaN, InGaN/AlGaN, InGaN/InGaN, InGaP/GaP, AlInGaP/InGaP, and InP/GaAs. In one embodiment, the well layers of the active layer 120 may be realized by an InGaN semiconductor and the barrier layers of the active layer 120 may be realized by an AlGaN semiconductor. In one embodiment, the well layers may have a higher content of indium than the barrier layers. The barrier layers may be free from indium. In addition, the well layers may be free from aluminum and the barrier layers may include aluminum. However, it should be understood that the compositions of the well layers and the barrier layers are not limited thereto.

If the thickness of the well layer is too thin, efficiency in confinement of carriers can be lowered, and if the thickness of the well layer is too thick, the carriers can be excessively confined. If the thickness of the barrier layer is too thin, efficiency in blocking electrons can be lowered. On the other hand, if the thickness of the barrier layer is too thick, the barrier layer can excessively block electrons.

Thus, by appropriately controlling the thicknesses of the barrier layers and the well layers, each carrier can be effectively confined in the well layers according to the wavelength of light and the quantum well structure.

In one embodiment, the well layers may have the same thickness or different thicknesses instead of being limited to a particular thickness. When the well layers have the same thickness, the well layers have the same quantum level and generate light having the same wavelength. In this case, a light emission spectrum having a narrow half width can be obtained. When the well layers have different thickness, the well layers generate light having different wavelengths, thereby increasing the half width of the light emission spectrum.

In one embodiment, at least one of the multiple barrier layers may include a dopant, for example, at least one selected from among an n-type dopant and a p-type dopant. When the barrier layer includes an n-type dopant, the barrier layer becomes an n-type semiconductor layer. When the barrier layer is an n-type semiconductor layer, efficiency in injection of electrons into the active layer 120 can increase.

In one embodiment, although the barrier layers may have various thicknesses, the uppermost barrier layer may have the same thickness as or a greater thickness than other barrier layers.

For the active layer 120 having the multi-quantum well layer structure, the compositions of the well layers and the barrier layers may be set depending upon a desired light emission wavelength of the light emitting element 100. In one embodiment, the multiple well layers may have the same composition or different compositions. For example, a well layer at a lower side of the active layer may contain a dopant and a well layer at an upper side thereof may not contain a dopant.

The second semiconductor layer 130 is formed on the active layer 120. The second semiconductor layer 130 is a semiconductor layer doped with a second conductivity type dopant having an opposite polarity to the first conductivity type dopant. The second conductivity type dopant may be a p-type dopant, for example, Mg, Zn, Ca, Sr, Ba, and the like.

In one embodiment, the second semiconductor layer 130 may include a nitride semiconductor material. The second semiconductor layer 130 may be formed of a semiconductor material having a composition represented by $In_xAl_yGa_{1-x-y}N$ ($0 \leq x \leq 1$, $0 \leq y \leq 1$, $0 \leq x+y \leq 1$). In some embodiments, the semiconductor material having the above composition may include GaN, AlN, AlGaN, InGaN, InN, InAlGaN, AlInN, and the like. The second semiconductor layer 130 may be formed by growing the semiconductor material so as to include the p-type dopant, such as Mg, Zn, Ca, Sr, Ba, and the like.

In one embodiment, an insulation layer 170 is formed on the first semiconductor layer 110 and the second semiconductor layer 130.

The first electrode 150 and the second electrode 160 are formed on the insulation layer 170 to be electrically connected to the first semiconductor layer 110 and the second semiconductor layer 130, respectively. Specifically, the first semiconductor layer 110, the active layer 120, and the second semiconductor layer 130 may be partially removed to expose a portion of the upper surface of the first semiconductor layer 110. Here, the exposed upper surface of the first semiconductor layer 110 may be an upper surface of the first sub-semiconductor layer. The first electrode 150 may be disposed on the first sub-semiconductor layer exposed on the first semiconductor layer 110. The second electrode 160 may be disposed on the second semiconductor layer 130.

In one embodiment, the first electrode 150 may include a first contact electrode 150C, which directly contacts the upper surface of the first semiconductor layer 110, and a first pad electrode 150P connected to the first contact electrode 150C through a contact hole formed through the insulation layer 170. The second electrode 160 may include a second contact electrode 160C, which directly contacts the upper surface of the second semiconductor layer 130, and a second pad electrode 160P connected to the second contact electrode 160C through a contact hole formed through the insulation layer 170.

However, it should be understood that the structures of the light emitting structure 101, the first electrode 150 and the second electrode 160 are not limited thereto and may be modified into various forms. For example, the light emitting structure 101 may have at least one mesa structure, and the first electrode 150 and the second electrode 160 may also be placed at different locations or may be formed in different shapes depending upon the mesa structure.

In one embodiment, the first and second electrodes 150, 160 may be formed of various metals, for example, Al, Ti, Cr, Ni, Au, Ag, Ti, Sn, Ni, Cr, W, and Cu, and alloys thereof. Each of the first and second electrodes 150, 160 may be composed of a single layer or multiple layers.

Referring again to FIG. 1, the first electrode 150 and the second electrode 160 are connected to the interconnect portions 1500, 1600, respectively. The interconnect portions 1500, 1600 may include a first interconnect 1500 connected to the first electrode 150 and a second interconnect 1600 connected to the second electrode 160. The first interconnect 1500 may include a first upper interconnect 1510, a first penetration interconnect 1520, and a first lower interconnect 1530; and the second interconnect 1600 may include a second upper interconnect 1610, a second penetration interconnect 1620, and a second lower interconnect 1630. The first electrode 150 may be electrically connected to the first upper interconnect 1510 through a conductive bonding member 1700, and the second electrode 160 may be electrically connected to the second upper interconnect 1610 through the conductive bonding member 1700.

In one embodiment, the conductive bonding member 1700 may be realized by a conductive paste, such as a solder paste, a silver paste, and the like, or may be realized by an anisotropic conductive film.

The sidewall 1200 is formed on the upper surface of the substrate 1100 and defines a cavity having a predetermined size therein. A portion of the sidewall having the cavity corresponds to a region in which the light emitting element 100 is disposed, and the light emitting element 100 is mounted on an exposed surface of the substrate 1100 inside the cavity. Here, a portion of each of the first interconnect 1500 and the second interconnect 1600 is disposed in a region on the substrate 1100, in which the cavity is formed, whereby the first interconnect 1500 and the second interconnect 1600 are partially exposed and the light emitting element 100 is mounted on the exposed portions of the first interconnect 1500 and the second interconnect 1600 to be connected thereto.

In some embodiments, the sidewall 1200 may be formed of an inorganic material, an organic material, and/or a metal. The sidewall 1200 may be formed of the same material as or a different material from the substrate 1100. For example, the substrate 1100 may be formed of an organic material and the sidewall 1200 may be formed of a highly reflective material, for example, an inorganic material, an organic material, or a metal, which has high reflectivity. However, it should be understood that the material of the sidewall 1200 is not limited thereto. When the sidewall 1200 is formed of a material, such as an organic polymer resin, the sidewall 1200 may have flexibility.

In one embodiment, an inner surface of the sidewall defining the cavity may be an inclined surface. As the inner surface of the sidewall has an inclined structure, light emitted from the light emitting element 100 can be directed upwards at a predetermined irradiation angle without any obstruction. Further, when the sidewall 1200 is formed of a reflective material, the light emitting element package may have improved efficiency in emission light from the light emitting element 100 in the upward direction.

The cover member 1400 is disposed on the light emitting element 100 and the sidewall 1200 to protect the light emitting element 100. The cover member 1400 may cover the entirety or a portion of an upper surface of the sidewall 1200 as shown in FIG. 1.

Although not shown in the drawings, a bonding agent may be disposed between the cover member 1400 and the sidewall 1200 such that the cover member 1400 can be stably bonded to the sidewall 1200 and the light emitting element 100 by the bonding agent. The bonding agent may be a heat curable bonding agent and/or a photocurable bonding agent.

The cover member 1400 directly contacts the upper surface of the light emitting element 100, whereby no empty space is formed between the cover member 1400 and the light emitting element 100. In other words, substantially no air gap is present between the cover member 1400 and the light emitting element 100, while an air gap 1402 is present between the light emitting element 100 and the sidewall 1200. Accordingly, the light emitting element package can minimize loss of light emitted from the light emitting element 10 through scattering or reflection of the light in the course of reentering the cover member 1400 after passing through the air gap.

In one embodiment, a distance from a surface of the substrate 1100 to the upper surface of the light emitting element 100 is substantially the same as the distance from the surface of the substrate 1100 to the upper surface of the sidewall 1200. The cover member 1400 covers both the upper surface of the light emitting element 100 and the upper surface of the sidewall 1200, and there is no substantial height difference between the upper surface of the light emitting element 100 and the upper surface of the sidewall 1200, thereby allowing the cover member 1400 to evenly cover the light emitting element 100 and the sidewall 1200 without flection. If there may be a height difference between the upper surface of the light emitting element 100 and the upper surface of the sidewall 1200, a portion of the upper surface of the light emitting element 100 may not contact the cover member 1400 or a portion of the upper surface of the sidewall 1200 may not contact the cover member 1400. In the former case, an air gap is formed between the upper surface of the light emitting element 100 and the cover member 1400, thereby deteriorating light extraction efficiency, and in the latter case, the cover member 1400 may not be stably attached to the sidewall 1200.

In some embodiments, the cover member 1400 may be formed of a light transmitting organic polymer material. The material of the cover member 1400 may be selected to allow transmission of light from the light emitting element 100 as much as possible. For example, the cover member 1400 may have a transmittance of about 80% in the UV to visible spectrum. In another embodiment, the cover member 1400 may have a transmittance of about 85% or more in the wavelength band of about 250 nm to about 400 nm.

The cover member 1400 may also have flexibility. In particular, the cover member 1400 may be formed of an organic polymer to easily achieve flexibility. In some embodiments, the cover member 1400 may be formed of the same type of organic polymer, for example, a Teflon-based organic polymer, as the reflective film 1300. In other embodiments, the cover member 1400 may be formed of a polytetrafluoroethylene resin.

In the light emitting element package according to this embodiment, the cover member 1400 may be manufactured in the form of a film having a predetermined thickness and attached to the light emitting element 100 and the sidewall 1200 via a bonding agent.

With this structure, the light emitting element package does not have a space between the cover member 1400 and the light emitting element 100, thereby improving light extraction efficiency from the light emitting element 100.

Further, according to some embodiments, at least some of the substrate 1100, the sidewall 1200, and the cover member 1400 may have flexibility, thereby providing flexibility to the entire structure of the light emitting element package. Accordingly, the light emitting element package according to this embodiment can used with or for various flexible apparatuses, for example, a flexible display and the like.

Furthermore, according to this embodiment, a number of light emitting element packages having the above structure may be manufactured concurrently through a chip-on-board process. For example, when a number of light emitting element packages are manufactured substantially at the same time through the chip-on-board process, a cover member having a large area capable of simultaneously covering a number of light emitting element package may be prepared and attached to all of the light emitting element packages.

A light emitting element package according to embodiments of the present invention may further include additional components for improving light extraction efficiency in addition to the components described above.

Figure 3:
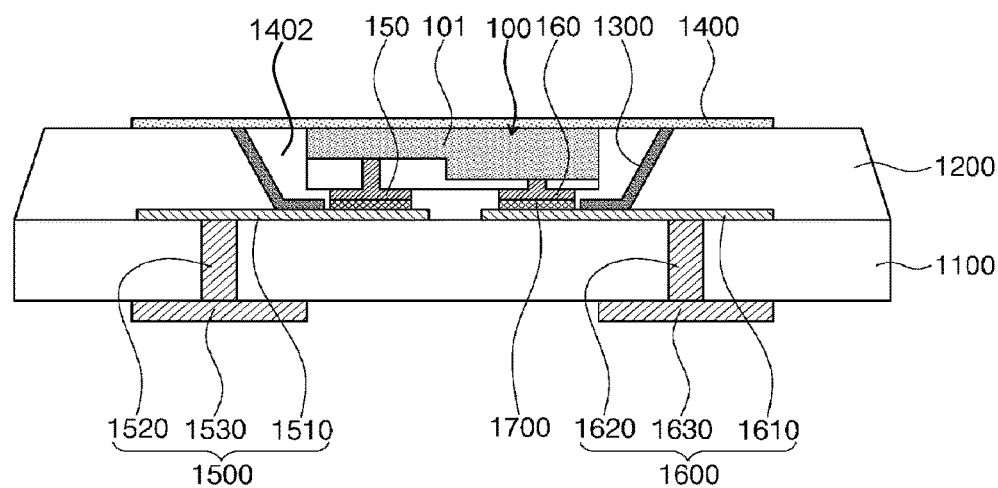
FIG. 3 is a sectional view of a light emitting element package according to another embodiment of the present invention.

FIG. 3 is a sectional view of a light emitting element package according to another embodiment of the present invention. The following description will focus on different features of other embodiments from those of the above embodiment and, for description of the same components, refer to the description of the above embodiments. Referring to FIG. 3, a light emitting element package according to another embodiment may further include a reflective film 1300 on the substrate 1100 and the sidewall 1200.

The reflective film 1300 is disposed on a region of the substrate 1100 exposed by the cavity of the sidewall 1200, exposed portions of the first upper interconnect 1510 and the second upper interconnect 1610, and at least part of the inner surface of the sidewall 1200. When light emitted from the light emitting element 100 travels through the air gap 1402 in a lateral direction or a downward direction instead of traveling in an upward direction, the reflective film 1300 reflects the light in the upward direction, thereby improving light extraction efficiency.

In some embodiments, since light does not travel directly under the light emitting element 100, the light emitting element package may not include the reflective film 1300, but the present disclosure is not limited thereto. For example, in order to maximize luminous efficacy, the reflective film 1300 may be formed not only on a lower side of the light emitting element 100, but also on the entirety of the upper surface of the substrate 1100 exposed by the cavity, on the upper surfaces of the first and second upper interconnects 1510, 1610, and on the entirety of the inclined surface of the sidewall 1200. However, in this embodiment, the reflective film 1300 is not formed on connecting portions between the first and second electrodes 150, 160 of the light emitting element 100 and the first and second upper interconnects 1510, 1610.

In one embodiment, the reflective film 1300 may be formed of a reflective organic polymer material. The reflective film 1300 may be formed of a reflective material capable of reflecting light from the light emitting element 100 as much as possible. For example, the reflective film 1300 may have a transmittance of about 80% in the UV to visible spectrum. In another embodiment, the reflective film 1300 may have a transmittance of about 85% or more in the wavelength band of about 250 nm to about 400 nm. In another embodiment, the reflective film 1300 may have a transmittance of about 90% or more, particularly in the UVC region, that is, in the wavelength band of about 100 nm to about 280 nm.

In order for the organic polymer to exhibit reflectivity, the organic polymer may be composed of a single layer or multiple layers, and at least one of the single layer or multiple layers may be subjected to stretch and expansion. Further, the organic polymer may have polymer nodes linked to each other by fibrils that form fine porous vacancies. There are various organic polymer materials having such a structure and reflectivity and, for example, Teflon® may be used. By way of example, the reflective film 1300 may be formed of a polytetrafluoroethylene resin subjected to stretch and expansion.

In some embodiments, the cover member 1400 and the reflective film 1300 may be formed of the same type of organic polymer, for example, a Teflon-based organic polymer. However, since it is desirable that the cover member 1400 have high transmittance and the reflective film 1300 have high reflectivity, transmittance and reflectivity thereof may be controlled through additional processing of the organic polymer material. For example, reflectivity of the reflective film 1300 may be increased through a process of forming the polymer nodes through stretch and expansion. Alternatively, even when the reflective film 1300 or the cover member 1400 is formed using the same material and/or the same process, it is possible to realize different transmittance and reflectivity through different thicknesses thereof. For example, the reflective film 1300 may be formed to a greater thickness than the thickness of the cover member 1400 to improve the reflectivity of the reflective film 1300 while maintaining transmittance of the cover member 1400.

In some embodiments, the reflective film 1300 may include a coating layer including a highly reflective material in addition to the organic polymer material. Alternatively, the reflective film 1300 may include fillers formed of a highly reflective material and added to the organic polymer material. In these embodiments, the highly reflective material may be titanium dioxide.

In the light emitting element package according to this embodiment, the reflective film 1300 may be formed by depositing the polymer material in a liquid phase on the substrate 1100 and the sidewall 1200, followed by curing. Here, the reflective film 1300 may be subjected to patterning through various processes, as needed. Alternatively, the reflective film 1300 may be formed by printing. However, it should be understood that the present invention is not limited thereto. Alternatively, the reflective film 1300 may be formed in the form of a film having a predetermined thickness to be attached to the upper surface of the substrate 1100 and the sidewall 1200.

In the embodiment, the reflective film 1300 may be formed of the organic polymer material, thereby providing flexibility to the reflective film 1300. According to some embodiments, at least some of the substrate 1100, the sidewall 1200, and the cover member 1400 may have flexibility, thereby providing flexibility to the entirety of the light emitting element package. Accordingly, the light emitting element package according to this embodiment has flexibility to be used for various flexible apparatuses, for example, a flexible display and the like.

Furthermore, according to this embodiment, a number of light emitting element packages each including the reflective film 1300 may be manufactured concurrently through a chip-on-board process. For example, when a number of light emitting element packages are manufactured at the same time through the chip-on-board process, the reflective film 1300 may be formed on all of the light emitting element packages at the same time.

In the light emitting element package according to the embodiments of the present invention, the cover member 1400 may be modified in various ways without departing from the spirit of the present invention.

Figure 4:
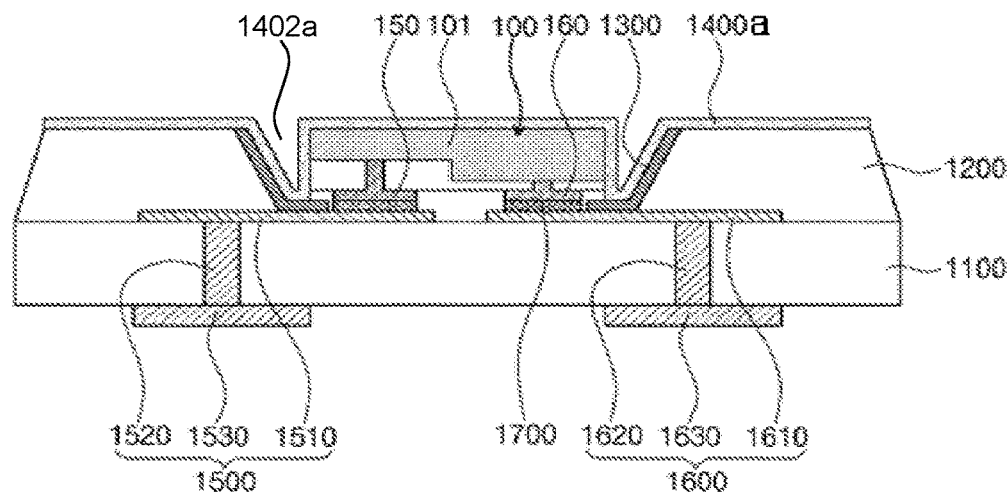
FIG. 4 is a sectional view of a light emitting element package according to a further another embodiment of the present invention.

FIG. 4 is a sectional view of a light emitting element package according to a further another embodiment of the present invention. Referring to FIG. 4, the cover member 1400a may be disposed on the light emitting element 100 and the sidewall 1200 to cover not only the upper surface of the light emitting element 100 but also a side surface of the light emitting element 100. In other words, the cover member 1400a directly contacts the upper and side surfaces of the light emitting element 100 and an empty space, that is, an air gap, is not formed between the cover member 1400a and the upper surface of the light emitting element 100 and between the cover member 1400a and the side surface of the light emitting element 100. Instead, an air gap 1402a is formed between portions of the cover member 1400a covering the side surfaces of the light emitting element 100 and the sidewall 1200.

Although the cover member 1400a is illustrated as covering the entire upper surface of the sidewall 1200 in this embodiment, it should be understood that the present invention is not limited thereto and the cover member 1400a may be formed to cover a portion of the upper surface of the sidewall 1200.

According to this embodiment, the cover member 1400a covers the upper surface of the sidewall 1200, a reflective surface corresponding to the inner surface of the sidewall 1200, and the upper and side surfaces of the light emitting element 100, thereby minimizing an air gap between the cover member 1400a and other components. As the air gap is minimized, the light emitting element package has improved light emission efficiency not only through the upper surface of the light emitting element 100 but also through the side surface thereof.

Further, according to this embodiment, an air gap encapsulated by the cover member 1400a is minimized, thereby minimizing expansion of air by heat discharged from the light emitting element 100. As a result, the cover member 1400a can stably protect the light emitting element 100 while improving light extraction efficiency.

In the light emitting element package according to this embodiment, since the cover member 1400a is formed of an organic polymer material, the cover member 1400a may be formed in various shapes. For example, the cover member 1400a may be formed by depositing or printing the polymer material in a liquid phase on the light emitting element 100 and the sidewall 1200, followed by curing.

In one embodiment, after deposition of the polymer material in a liquid phase, primary baking may be performed at a temperature of about 120° C. to about 180° C., for example, at 150° C., in order to minimize the air gap and moisture. Thereafter, secondary baking may be performed at a higher temperature than primary baking in order to provide a predetermined shape of the polymer material. Secondary baking may be performed at a temperature of about 250° C. to about 350° C., for example, at 300° C. In this embodiment, upon primary baking and secondary baking, the temperature may be elevated at a predetermined rate, for example, at 40° C./min to 60° C./min or at 50° C./min in order to prevent thickness reduction and stress application due to rapid aggregation of the polymer material upon heating.

In this embodiment, the cover member 1400a may be formed without a separate bonding agent. As such, the intensity of light, the traveling direction of light, for example, a light emission angle, and the like may be controlled by controlling the thickness or shape of the cover member 1400a upon formation of the cover member 1400a.

In some embodiments, the sidewall 1200 may be omitted as needed.

Figure 5:
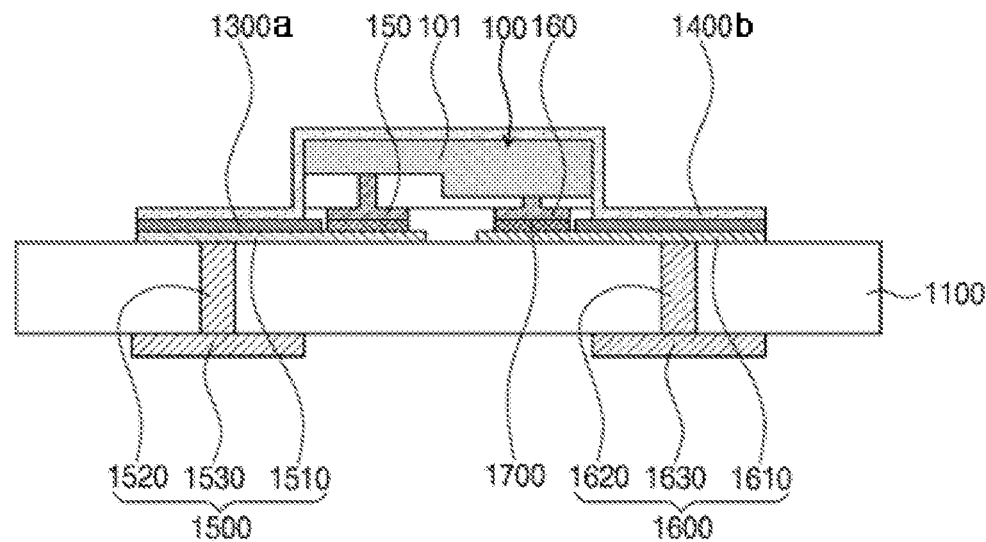
FIG. 5 is a sectional view of a light emitting element package according to yet another embodiment of the present invention.

FIG. 5 is a sectional view of a light emitting element package according to yet another embodiment of the present invention. Referring to FIG. 5, the reflective film 1300a is disposed on the substrate 1100. The reflective film 1300a may be formed on the entirety of the substrate 1100 excluding the connecting portions between the light emitting element 100 and the interconnect portions 1500, 1600, and may be formed on a portion of the substrate 1100, as shown in FIG. 5. The light emitting element 100 is connected to the interconnect portions 1500, 1600 formed on the substrate 1100 in a region in which the reflective film 1300a is not formed.

In this embodiment, the cover member 1400b may be disposed on the light emitting element 100 and the reflective film 1300a to cover not only the upper surface of the light emitting element 100 but also the side surface of the light emitting element 100. In other words, the cover member 1400b directly contacts the upper and side surfaces of the light emitting element 100. Accordingly, an empty space, that is, an air gap, is not formed between the cover member 1400b and the upper surface of the light emitting element 100 and between the cover member 1400b and the side surface of the light emitting element 100.

Although the cover member 1400b is illustrated as covering the upper surface of the reflective film 1300a without covering the upper surface of the substrate 1100 in this embodiment, it should be understood that this structure is provided by way of example. In other embodiments, the cover member 1400b may extend to the exposed region of the substrate 1100 to cover the exposed upper surface of the substrate 1100, the upper surface of the reflective film 1300a, and the upper and side surfaces of the light emitting element 100.

According to this embodiment, the cover member 1400b covers the upper surface and the reflective surface of the sidewall 1200 and the upper and side surfaces of the light emitting element 100, thereby minimizing an air gap between the cover member 1400b and other components. As the air gap is minimized, the light emitting element package can improve efficiency in light emission not only through the upper surface of the light emitting element 100 but also through the side surface thereof.

Further, according to this embodiment, an air gap encapsulated by the cover member 1400b is minimized, thereby minimizing expansion of air by heat discharged from the light emitting element 100. As a result, the cover member 1400b can stably protect the light emitting element 100 while improving light extraction efficiency.

Furthermore, for the light emitting element 100 adapted to emit light at a great beam angle, light emission both in the upward direction and in the lateral direction is important. In this case, by adopting the structure not including the sidewall 1200, it is possible to avoid restriction of the traveling direction of light by the sidewall 1200.

In the light emitting element package according to this embodiment, the cover member 1400b may be formed by depositing or printing the polymer material in a liquid phase on the substrate 1100 on which the light emitting element 100 and the reflective film 1300a are formed, followed by curing. According to this embodiment, the cover member 1400b may be formed without a separate bonding agent.

In this embodiment, the intensity of light, the traveling direction of light, and the like may be controlled by controlling the thickness or shape of the cover member 1400b upon formation of the cover member 1400b.

In some embodiments, the cover member 1400b may be formed in a structure wherein an air gap is not formed between the cover member 1400b and the light emitting element 100.

Figure 6:
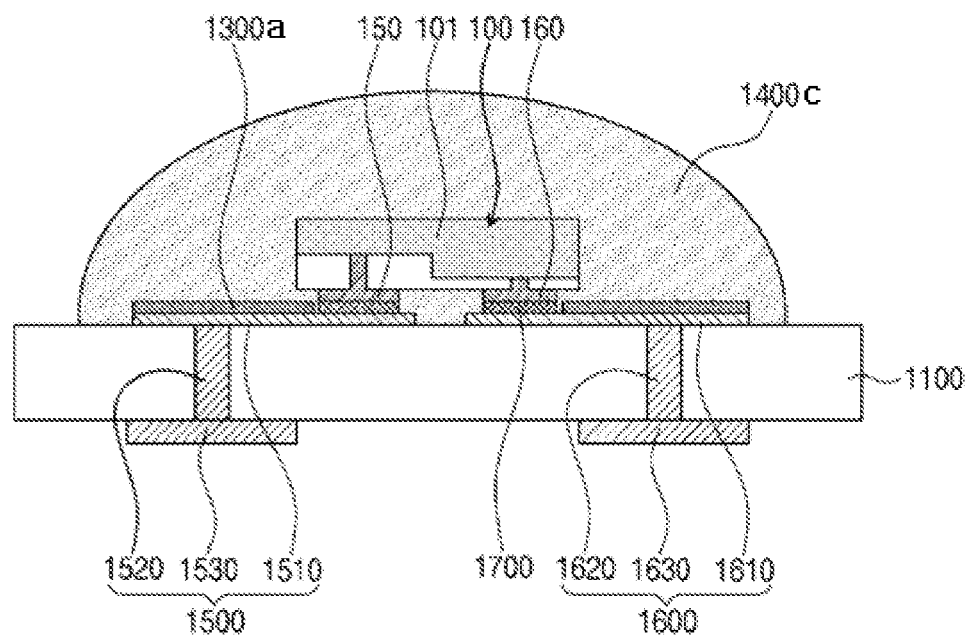
FIG. 6 is a sectional view of a light emitting element package according to yet another embodiment of the present invention.

FIG. 6 is a sectional view of a light emitting element package according to yet another embodiment of the present invention.

Referring to FIG. 6, the reflective film 1300a is disposed on the substrate 1100 without the sidewall 1200. The cover member 1400c is formed on the light emitting element 100 and the reflective film 1300a such that a space between the substrate 1100 and the light emitting element 100 is filled with the cover member 1400c. In other words, in the above embodiments, the cover member 1400c directly contacts the upper and side surfaces of the light emitting element 100 and is not formed on a lower surface of the light emitting element 100, whereas the cover member 1400c is formed not only on the upper and side surfaces of the light emitting element 100, but also on the lower surface of the light emitting element 100 in this embodiment.

To this end, the cover member 1400c may be formed by dropping droplets of the polymer material in a liquid phase so as to surround the upper and side surfaces of the light emitting element 100 while filling a space under the light emitting element 100 and the substrate 1100, followed by curing. In this embodiment, the cover member 1400c may be formed without a separate bonding agent. In this case, since the droplets of the polymer material in a liquid phase are dropped, the cover member 1400c may be formed in a substantially semi spherical shape.

In this embodiment, the cover member 1400c covers the entirety of the light emitting element 100 such that an air gap is not formed between the light emitting element 100 and the substrate 1100 or between the light emitting element 100 and the cover member 1400c. With this structure, the light emitting element package has improved light emission efficiency not only through the upper surface of the light emitting element 100 but also through the side surface thereof.

Furthermore, the intensity of light, the traveling direction of light, for example, a light emission angle, and the like may be controlled by controlling the thickness or shape of the cover member 1400c upon formation of the cover member 1400c. In particular, when the cover member 1400c is formed in a semispherical shape, the cover member 1400c may have a lens shape, thereby enabling increase in beam angle corresponding to this shape and control of the traveling direction of light to increase or decrease the quantity of light in a particular direction. According to this embodiment, since the sidewall 1200 is omitted, the light emitting element package has a high degree of freedom in manufacture of the cover member 1400c in a desired shape, thereby enabling various changes of the traveling direction of light.

Although some exemplary embodiments have been described herein, it should be understood by those skilled in the art that these embodiments are given by way of example only, and that various modifications, variations, and alterations can be made without departing from the spirit and scope of the present invention.

Therefore, the scope of the present invention should be interpreted according to the following appended claims and equivalents thereto.

We claim:

1. A light emitting element package comprising:
a substrate provided with an interconnect portion;
a sidewall disposed on the substrate;
a light emitting element mounted on the substrate, wherein the light emitting element comprises a flip-chip type light emitting diode, wherein one of the first electrode or the second electrode is connected to the interconnect portion; and
a cover member contacting an upper surface of the light emitting element while covering the light emitting element,
wherein:
the cover member comprises an organic polymer having polymer nodes linked to each other and has a light transmittance of 85% or more in an ultraviolet wavelength range;
the cover member is structured to extend beyond the upper surface of the light emitting element and cover a portion of an upper surface of the substrate located adjacent to the light emitting element;
the light emitting element package includes an air gap in a region located below the upper surface of the light emitting element and above at least a portion of the interconnect portion located on the upper surface of the substrate and adjacent to a side surface of the light emitting element;
the cover member contacts an upper surface of the light emitting element and an upper surface of the sidewall;
the upper surfaces of the light emitting element and the sidewall are aligned; and
the air gap is located below the cover member.

2. The light emitting element package of claim 1, further comprising a reflective film formed on the substrate, wherein the reflective film comprises an organic polymer and the organic polymer of the reflective film is stretchable and expandable, and wherein the cover member covers the reflective film.

3. The light emitting element package of claim 1, wherein the light emitting element includes an insulation layer on which a first electrode and a second electrode are formed.

4. The light emitting element package of claim 1, wherein the cover member, substrate, and sidewall have flexibility.

5. The light emitting element package of claim 1, wherein the substrate, the cover member, or both have flexibility.

6. The light emitting element package of claim 1, wherein the interconnect portion comprises:
an upper interconnect disposed on an upper surface of the substrate and connected to the one of the first electrode or the second electrode of the light emitting element;
a penetration interconnect penetrating the substrate and connected to the upper interconnect; and
a lower interconnect disposed on a lower surface of the substrate and connected to the penetration interconnect.

7. The light emitting element package of claim 6, wherein the penetration interconnect is located below the sidewall.

8. The light emitting element package of claim 1, wherein the interconnect portion includes an upper interconnect formed on the upper surface of the substrate, and wherein the one of the first electrode or the second electrode is electrically connected the upper interconnect.

9. The light emitting element package of claim 8, wherein the upper interconnect is partially covered by the sidewall.

10. The light emitting element package of claim 9, wherein the interconnect portion further includes a penetration interconnect that penetrates the substrate, wherein the penetration interconnect is connected to a location of the upper interconnect covered by the sidewall.

11. The light emitting element package of claim 1, further comprising a reflective film formed on the substrate, wherein the reflective film has a light transmittance of 85% or more in the wavelength band of 250 nm to 400 nm.

12. The light emitting element package of claim 11, wherein the reflective film comprises organic polymers having polymer nodes linked to each other by fibrils forming fine porous vacancies.

13. The light emitting element package of claim 12, wherein the organic polymers of the reflective film further comprise a polytetrafluoroethylene resin, the polytetrafluoroethylene resin being stretchable and expandable.

14. The light emitting element package of claim 1, wherein the sidewall defines a cavity in which the light emitting element is disposed.

15. The light emitting element package of claim 14, wherein the cover member encapsulates the cavity.

16. The light emitting element package of claim 14, wherein the cover member has flexibility.

17. The light emitting element package of claim 14, wherein an inner surface of the sidewall defining the cavity includes an inclined surface.

18. The light emitting element package of claim 17, further comprising a reflective film formed on the substrate, wherein at least a part of the reflective film is disposed on the inner surface of the sidewall.

19. A light emitting element package comprising:
a substrate provided with an interconnect portion including an upper interconnect formed on the substrate;
a sidewall disposed on the substrate;
a reflective film formed on the substrate;
a light emitting element mounted on the substrate, wherein the light emitting element comprises a flip-chip type light emitting diode, wherein one of the first electrode or the second electrode is connected to the interconnect portion; and
a cover member contacting an upper surface of the light emitting element while covering the light emitting element, wherein the cover member and the reflective film comprise organic polymers and an organic polymer of the reflective film has polymer nodes linked to each other by fibrils forming fine porous vacancies;
wherein:
the cover member is structured to extend beyond an upper surface of the light emitting element and cover the reflective film formed on the substrate and the upper interconnect;
the light emitting element package includes an air gap in a region located below the upper surface of the light emitting element and above at least a portion of the upper interconnect located adjacent to a side surface of the light emitting element;
the cover member contacts an upper surface of the light emitting element and an upper surface of the sidewall;
the upper surfaces of the light emitting element and the sidewall are aligned; and
the air gap is located below the cover member.

20. A light emitting element package comprising:
a substrate provided with an interconnect portion including an upper interconnect formed on the substrate;
a sidewall disposed on the substrate;
a reflective film formed on the substrate;
a light emitting element mounted on the substrate, wherein the light emitting element comprises a flip-chip type light emitting diode including an insulation layer on which a first electrode and a second electrode are formed, wherein one of the first electrode or the second electrode is connected to the interconnect portion; and
a cover member contacting an upper surface of the light emitting element while covering the light emitting element, wherein each of the cover member and the reflective film comprises organic polymers, and a thickness of the reflective film is different from a thickness of the cover member;
wherein:
the cover member is structured to extend beyond an upper surface of the light emitting element and cover the reflective film formed on the substrate and the upper interconnect;
the light emitting element package includes an air gap in a region located below the upper surface of the light emitting element and above at least a portion of the upper interconnect located adjacent to a side surface of the light emitting element;
the cover member contacts an upper surface of the light emitting element and an upper surface of the sidewall;
the upper surfaces of the light emitting element and the sidewall are aligned; and
the air gap is located below the cover member.

* * * * *